(12) United States Patent
Wen et al.

(10) Patent No.: US 12,622,161 B2
(45) Date of Patent: May 5, 2026

(54) DISPLAY SUBSTRATE AND RELATED DEVICE

(71) Applicant: BOE Technology Group Co., Ltd., Beijing (CN)

(72) Inventors: Guanyin Wen, Beijing (CN); Yue Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 617 days.

(21) Appl. No.: 17/800,683

(22) PCT Filed: Nov. 11, 2021

(86) PCT No.: PCT/CN2021/130053

§ 371 (c)(1),
(2) Date: Aug. 18, 2022

(87) PCT Pub. No.: WO2022/160860

PCT Pub. Date: Aug. 4, 2022

(65) Prior Publication Data

US 2023/0074902 A1 Mar. 9, 2023

(30) Foreign Application Priority Data

Feb. 1, 2021 (CN) .......................... 202110137385.6

(51) Int. Cl.
*H01L 27/32* (2006.01)
*H01L 51/00* (2006.01)
(Continued)

(52) U.S. Cl.
CPC ....... *H10K 59/8791* (2023.02); *H10K 59/122* (2023.02); *H10K 71/00* (2023.02);
(Continued)

(58) Field of Classification Search
CPC ......... H10K 59/122; H10K 59/35–353; H10K 59/8791; G09G 2320/0209; G09G 2320/0242
See application file for complete search history.

(56) References Cited

U.S. PATENT DOCUMENTS

| | | | | |
|---|---|---|---|---|
| 10,651,412 B2 * | 5/2020 | Yang | ...................... | H10K 50/16 |
| 11,552,269 B2 * | 1/2023 | Zhang | .................... | H10K 50/15 |

(Continued)

FOREIGN PATENT DOCUMENTS

| | | |
|---|---|---|
| CN | 103855193 A | 6/2014 |
| CN | 104617231 A | 5/2015 |

(Continued)

OTHER PUBLICATIONS

International Searching Authority, Written Opinion of International Searching Authority, International application No. PCT/CN2021/130053, Feb. 10, 2022, all pages. (Year: 2022).*

(Continued)

*Primary Examiner* — Victoria K. Hall
(74) *Attorney, Agent, or Firm* — IPro, PLLC

(57) ABSTRACT

Provided are a display substrate and a related device, belonging to the technical field of display. The display substrate includes a first sub-pixel and a second sub-pixel provided on a base substrate and having different colors. An orthographic projection of a first organic light-emitting layer of the first sub-pixel and an orthographic projection of a second organic light-emitting layer of the second sub-pixel onto the base substrate have an overlapping area, an insulating blocking layer is provided between the first organic light-emitting layer and the second organic light-emitting layer, and an orthographic projection of the blocking layer onto the base substrate covers at least part of the overlapping
(Continued)

area. The technical solution of the present disclosure can prevent crosstalk between adjacent pixels.

13 Claims, 4 Drawing Sheets

(51) Int. Cl.

| | | |
|---|---|---|
| *H01L 51/56* | (2006.01) | |
| *H10K 59/122* | (2023.01) | |
| *H10K 59/80* | (2023.01) | |
| *H10K 71/00* | (2023.01) | |
| *H10K 71/13* | (2023.01) | |
| *H10K 71/16* | (2023.01) | |
| H10K 59/35 | (2023.01) | |

(52) U.S. Cl.

CPC ......... *H10K 71/135* (2023.02); *H10K 71/164* (2023.02); *H10K 59/352* (2023.02); *H10K 59/353* (2023.02)

(56) References Cited

U.S. PATENT DOCUMENTS

| | | | | |
|---|---|---|---|---|
| 12,317,718 | B2 * | 5/2025 | Li | ......................... H10K 59/121 |
| 2013/0140533 | A1 | 6/2013 | Lee et al. | |
| 2014/0361260 | A1 | 12/2014 | Kim et al. | |
| 2016/0301027 | A1 | 10/2016 | Wang et al. | |
| 2016/0380035 | A1 * | 12/2016 | Cho | ......................... H10K 50/17 |
| | | | | 257/40 |
| 2017/0012230 | A1 | 1/2017 | Yan | |
| 2017/0047550 | A1 * | 2/2017 | Lee | ......................... H10K 50/11 |
| 2018/0026219 | A1 * | 1/2018 | Li | ......................... H10K 50/11 |
| | | | | 257/40 |
| 2019/0013370 | A1 | 1/2019 | Nie | |
| 2019/0206946 | A1 | 7/2019 | Xu et al. | |
| 2020/0013832 | A1 | 1/2020 | Ren et al. | |
| 2020/0035951 | A1 * | 1/2020 | Cheon | ..................... H10K 50/17 |

| | | | | |
|---|---|---|---|---|
| 2020/0075702 | A1 * | 3/2020 | Zhang | ..................... H10K 59/35 |
| 2020/0111985 | A1 * | 4/2020 | Li | ......................... H10K 50/13 |
| 2020/0395422 | A1 | 12/2020 | Xu et al. | |
| 2021/0126228 | A1 | 4/2021 | You et al. | |
| 2021/0193946 | A1 * | 6/2021 | Zhang | ..................... H10K 50/15 |
| 2021/0273028 | A1 | 9/2021 | Wu et al. | |
| 2022/0069031 | A1 * | 3/2022 | Yue | ...................... H10K 59/352 |

FOREIGN PATENT DOCUMENTS

| | | | | | |
|---|---|---|---|---|---|
| CN | 105895664 | A | | 8/2016 | |
| CN | 106298847 | A | | 1/2017 | |
| CN | 106449726 | A | * 2/2017 | ........... H10K 59/122 |
| CN | 107240599 | A | | 10/2017 | |
| CN | 107275377 | A | | 10/2017 | |
| CN | 107293572 | A | | 10/2017 | |
| CN | 108172602 | A | | 6/2018 | |
| CN | 108598123 | A | | 9/2018 | |
| CN | 208157411 | U | | 11/2018 | |
| CN | 110459558 | A | | 11/2019 | |
| CN | 110993678 | A | * 4/2020 | ........... H10K 59/122 |
| CN | 111969114 | A | | 11/2020 | |
| CN | 112968135 | A | | 6/2021 | |
| IN | 107346778 | A | | 11/2017 | |
| JP | 2019067747 | A | | 4/2019 | |

OTHER PUBLICATIONS

International Searching Authority, International Search Report, International application No. PCT/CN2021/130053, Feb. 10, 2022, all pages. (Year: 2022).*

Machine translation, Zhang, Chinese Pat. Pub. No. CN110993678A, translation date: Mar. 4, 2025, Espacenet, all pages. (Year: 2025).*

Machine translation, Liu, Chinese Pat. Pub. No. CN106449726A, translation date: Mar. 4, 2025, Espacenet, all pages. (Year: 2025).*

CN 202110137385.6 first office action.

PCT/CN2021/130053 International search report and written opinion.

CN 202110137385.6 third office action.

* cited by examiner

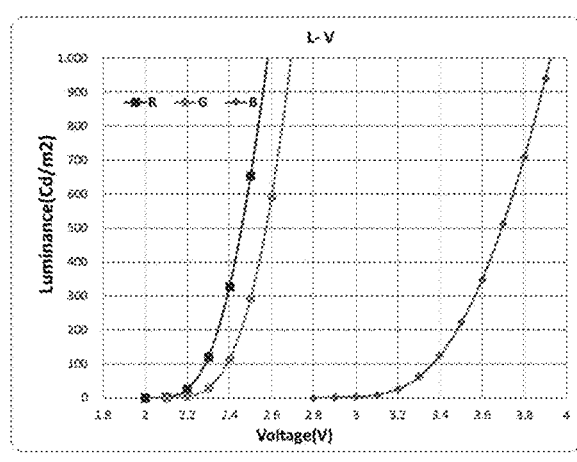

Fig. 1

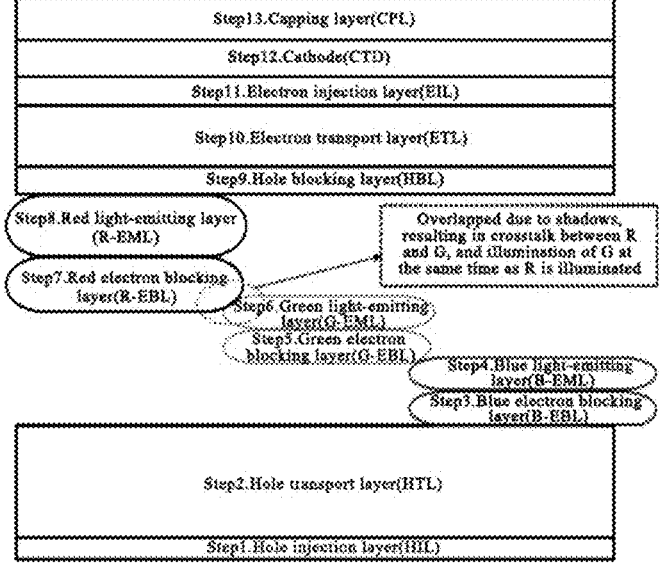

Fig. 2    -Related Art-

| Step13.Capping layer(CPL) |
| Step12.Cathode(CTD) |
| Step11.Electron injection layer(EIL) |
| Step10.Electron transport layer(ETL) |
| Step9.Hole blocking layer(HBL) |

Step8.Red light-emitting layer (R-EML)

Step7.Red electron blocking layer(R-EBL)

Overlapped due to shadows, resulting in crosstalk between R and G, and illumination of G at the same time as R is illuminated Step6.Green light-emitting layer(G-EML)

Step5.Green electron blocking layer(G-EBL)

Step4.Blue light-emitting layer(B-EML)

Step3.Blue electron blocking layer(B-EBL)

| Step2.Hole transport layer(RTL) |
| Step1.Hole injection layer(HIL) |

Fig. 3

DISPLAY SUBSTRATE AND RELATED DEVICE

CROSS-REFERENCE TO RELATED APPLICATION

This application is the U.S. national phase of PCT Application No. PCT/CN2021/130053 filed on Nov. 11, 2021, which claims priority to Chinese Patent Application No. 202110137385.6 filed in China on Feb. 1, 2021, the disclosure of which are incorporated in their entirety by reference herein.

TECHNICAL FIELD

The present disclosure relates to the technical field of display, and more particularly, to a display substrate, and a related device.

BACKGROUND

Organic Light Emitting Diode (OLED) display devices are one of the hot spots in the field of flat panel displays. Compared with liquid crystal displays, OLED display devices have many advantages such as low power consumption, low production cost, self-luminescence, wide viewing angle, fast response, and so forth. At present, in the field of flat panel displays, OLED display devices have begun to replace the traditional Liquid Crystal Displays (LCDs).

SUMMARY

The technical problem to be solved by the present disclosure is to provide a display substrate, and a related device, which can prevent crosstalk between adjacent pixels effectively.

In order to solve the above technical problem, the embodiments of the present disclosure provide the following technical solutions.

In an aspect, a display substrate is provided, including a first sub-pixel and a second sub-pixel provided on a base substrate and having different colors, wherein an orthographic projection of a first organic light-emitting layer of the first sub-pixel and an orthographic projection of a second organic light-emitting layer of the second sub-pixel onto the base substrate have an overlapping area, an insulating blocking layer is provided between the first organic light-emitting layer and the second organic light-emitting layer, and an orthographic projection of the blocking layer onto the base substrate covers at least part of the overlapping area.

In some embodiments, the orthographic projection of the blocking layer onto the base substrate covers the whole overlapping area.

In some embodiments, the first organic light-emitting layer, the blocking layer and the second organic light-emitting layer are arranged in sequence in a direction away from the base substrate, an orthographic projection of a first part, away from the surface of the base substrate, of the first organic light-emitting layer onto the base substrate coincides with the overlapping area, the first organic light-emitting layer includes a first side surface close to the second organic light-emitting layer and intersecting the first part, and the blocking layer covers the first part and the first side surface.

In some embodiments, the display substrate includes a pixel definition layer on the base substrate, the pixel definition layer includes a plurality of pixel definition layer openings corresponding to sub-pixels, and the orthographic projection of the blocking layer onto the base substrate is located within an orthographic projection of the pixel definition layer onto the base substrate.

In some embodiments, the display substrate includes a red sub-pixel, a green sub-pixel and a blue sub-pixel, and the first sub-pixel and the second sub-pixel are selected from the red sub-pixel, the green sub-pixel and the blue sub-pixel.

In some embodiments, the first sub-pixel is one selected from the green sub-pixel and the red sub-pixel, and the second sub-pixel is the other one selected from the green sub-pixel and the red sub-pixel.

In some embodiments, the display substrate further includes a hole transport layer between the organic light-emitting layer and the base substrate, and the blocking layer is located on a side of the hole transport layer away from the base substrate.

In some embodiments, the display substrate further includes a third sub-pixel, the third sub-pixel includes a third organic light-emitting layer, the blocking layer includes a first blocking layer and a second blocking layer, the first blocking layer is located between the first organic light-emitting layer and the second organic light-emitting layer, and the second blocking layer is located between the second organic light-emitting layer and the third organic light-emitting layer.

In some embodiments, a distance between a surface of the first blocking layer on the side close to the base substrate and a surface of the base substrate on the side close to the first blocking layer is a first distance, the distance between a surface of the second blocking layer on the side close to the base substrate and a surface of the base substrate on the side close to the second blocking layer is a second distance, and the first distance is different from the second distance.

In some embodiments, in a direction away from the base substrate, the organic light-emitting layer includes an electron blocking layer EBL and a light-emitting layer EML which are laminated.

In some embodiments, the first blocking layer is located between the EML of the first organic light-emitting layer and the EBL of the second organic light-emitting layer, and the second blocking layer is located between the EML of the second organic light-emitting layer and the EBL of the third organic light-emitting layer. In some embodiments, the blocking layer has a thickness of 10 nm to 50 nm.

In some embodiments, the blocking layer has a mobility of less than $10^{-8}$ cm$^2$/(V·s).

In some embodiments, the blocking layer is made of silicon nitride.

An embodiment of the present disclosure further provides a display device including the display substrate described above.

An embodiment of the present disclosure further provides a method for manufacturing the display substrate, the display substrate including a first sub-pixel and a second sub-pixel provided on a base substrate and having different colors, wherein an orthographic projection of a first organic light-emitting layer of the first sub-pixel and an orthographic projection of a second organic light-emitting layer of the second sub-pixel onto the base substrate have an overlapping area, the manufacturing method including: forming an insulating blocking layer between the first organic light-emitting layer and the second organic light-emitting layer, wherein an orthographic projection of the blocking layer onto the base substrate covers at least part of the overlapping area.

In some embodiments, the manufacturing method specifically includes: forming the first organic light-emitting layer;

forming the blocking layer in the overlapping area by evaporation or inkjet printing or chemical vapor deposition; and forming the second organic light-emitting layer.

An embodiment of the present disclosure further provides a high-precision metal mask plate for manufacturing the display substrate described above, including: a plurality of opening areas, the plurality of opening areas including a first opening area corresponding to the position of sub-pixels of the display substrate, and further including a second opening area corresponding to the overlapping area.

The embodiments of present disclosure have the following beneficial effects: in the technical solutions described above, the insulating blocking layer is provided at the junction of the first organic light-emitting layer and the second organic light-emitting layer, and the blocking layer can block the flow of holes. When the first sub-pixel is illuminated, the blocking layer can block holes injected from the first organic light-emitting layer into the second organic light-emitting layer, so as to prevent illuminating the second sub-pixel at the same time as illuminating the first sub-pixel; or, when the second sub-pixel is illuminated, the blocking layer can block holes injected from the second organic light-emitting layer into the first organic light-emitting layer, so as to prevent illuminating the first sub-pixel at the same time as illuminating the second sub-pixel, so that crosstalk can be prevented between adjacent pixels, and the display effect can be ensured.

BRIEF DESCRIPTION OF THE DRAWINGS

FIG. 1 shows a schematic diagram illustrating turn-on voltages of a red sub-pixel, a green sub-pixel and a blue sub-pixel;

FIG. 2 shows a schematic cross-sectional view of a display substrate in the related art;

FIGS. 3 and 4 show schematic diagrams illustrating the structure of a light-emitting unit;

REFERENCE NUMERALS

Figure 4:
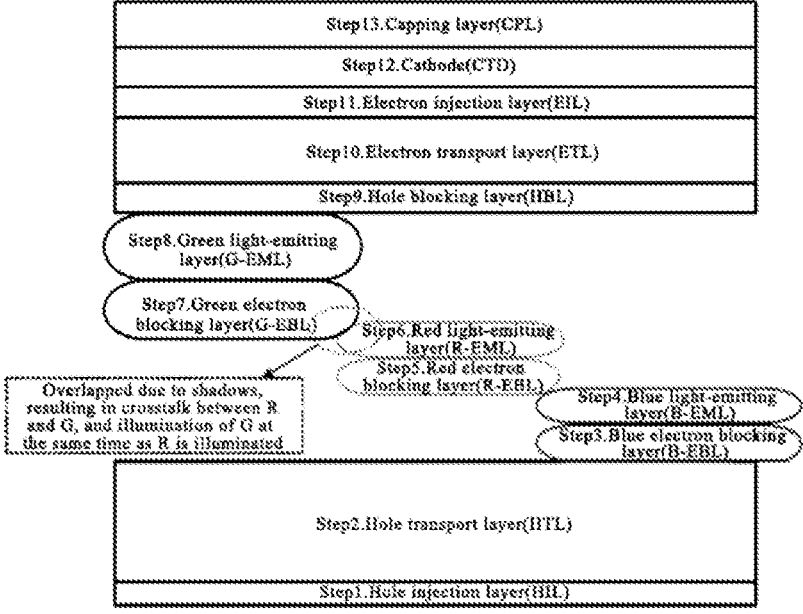

1 TFT array substrate
2 Anode
3 Pixel definition layer
4 Red organic light-emitting layer
5 Green organic light-emitting layer
6 Blocking layer

DETAILED DESCRIPTION

In order that the technical problems, technical solutions, and advantages to be solved by the embodiments of the present disclosure will become more apparent, a detailed description will be given below with reference to the accompanying drawings and specific embodiments.

With the continuous improvement of display screen resolution, the distances between sub-pixels are getting closer and closer, and the pixel definition layer gap (PDL Gap)

between sub-pixels is getting smaller and smaller. As shown in FIG. 1, in an OLED display substrate, the turn-on voltages of a red sub-pixel (R) and a green sub-pixel (G) are very close, approximately between 2.0-2.2 V, and the turn-on voltage of a blue sub-pixel (B) is maximum, approximately around 2.8 V. Specifically, each curve as illustrated in FIG. 1 represents the relationship between the applied voltage (Voltage) and the luminance (Luminance) of each sub-pixel.

In manufacturing of an OLED display substrate, organic light-emitting layers of different colors are sequentially evaporated on a thin film transistor (TFT) array substrate 1. As the evaporation mask plate has a certain thickness, shadows may appear during evaporation of organic material, and the PDL Gap is very small, which will lead to overlapping between organic light-emitting layers of adjacent sub-pixels. As shown in FIG. 2, a first organic light-emitting layer 4 of a first sub-pixel may contact with a second organic light-emitting layer 5 of an adjacent second sub-pixel, so that a contact area exists between the first organic light-emitting layer 4 and the second organic light-emitting layer 5. When the first sub-pixel is illuminated, holes are laterally transported in the first organic light-emitting layer 4 to be injected from the first organic light-emitting layer 4 into the second organic light-emitting layer 5, so that the second sub-pixel is also illuminated at the same time as the first sub-pixel is illuminated, and the second sub-pixel may affect the illumination of the first sub-pixel and affect the display effect. Alternatively, when the second sub-pixel is illuminated, holes are laterally transported in the second organic light-emitting layer 5 to be injected from the second organic light-emitting layer 5 into the first organic light-emitting layer 4, so that the first sub-pixel is also illuminated at the same time as the second sub-pixel is illuminated, and the first sub-pixel may affect the illumination of the second sub-pixel and affect the display effect.

The embodiments of the present disclosure provide a display substrate, and a related device, which can prevent crosstalk between adjacent pixels.

An embodiment of the present disclosure provides a display substrate, including a first sub-pixel and a second sub-pixel provided on a base substrate and having different colors, wherein an orthographic projection of a first organic light-emitting layer of the first sub-pixel and an orthographic projection of a second organic light-emitting layer of the second sub-pixel onto the base substrate have an overlapping area, an insulating blocking layer is provided between the first organic light-emitting layer and the second organic light-emitting layer, and an orthographic projection of the blocking layer onto the base substrate covers at least part of the overlapping area.

The first organic light-emitting layer is an organic light-emitting layer of one sub-pixel of two adjacent sub-pixels, and the second organic light-emitting layer is an organic light-emitting layer of the other sub-pixel of the two adjacent sub-pixels. The positions of the first organic light-emitting layer and the second organic light-emitting layer are not limited, and the first organic light-emitting layer may be located on a side of the second organic light-emitting layer close to the base substrate, and may also be located on a side of the second organic light-emitting layer away from the base substrate. In manufacturing of the OLED display substrate, it is possible that the first organic light-emitting layer is evaporated first, and then the second organic light-emitting layer is evaporated. It is also possible that the second organic light-emitting layer is evaporated first, and then the first organic light-emitting layer is evaporated. As the first organic light-emitting layer and the second organic light-emitting layer are adjacent in the evaporation sequence, there is a possibility that the first organic light-emitting layer and the second organic light-emitting layer overlap.

In this embodiment, the insulating blocking layer is provided at the junction of the first organic light-emitting layer and the second organic light-emitting layer, and the blocking layer can block the flow of holes. Accordingly, when the first sub-pixel is illuminated, the blocking layer can block holes injected from the first organic light-emitting layer into the second organic light-emitting layer, so as to prevent illuminating the second sub-pixel at the same time as illuminating the first sub-pixel; or, when the second sub-pixel is illuminated, the blocking layer can block holes injected from the second organic light-emitting layer into the first organic light-emitting layer, so as to prevent illuminating the first sub-pixel at the same time as illuminating the second sub-pixel, so that crosstalk can be prevented from happening at a place between adjacent pixels, and the display effect can be further ensured.

In manufacturing of the OLED display substrate, when organic light-emitting layers of different colors are sequentially evaporated on the TFT array substrate 1, the order of evaporation of the organic light-emitting layers is generally as follows: the organic light-emitting layer of the blue sub-pixel→the organic light-emitting layer of the green sub-pixel→the organic light-emitting layer of the red sub-pixel. Alternatively, the organic light-emitting layer of the blue sub-pixel→the organic light-emitting layer of the red sub-pixel→the organic light-emitting layer of the green sub-pixel. In a direction away from the base substrate, the organic light-emitting layer includes an electron blocking layer (EBL) and a light-emitting layer (EML), which are laminated.

Figure 5:
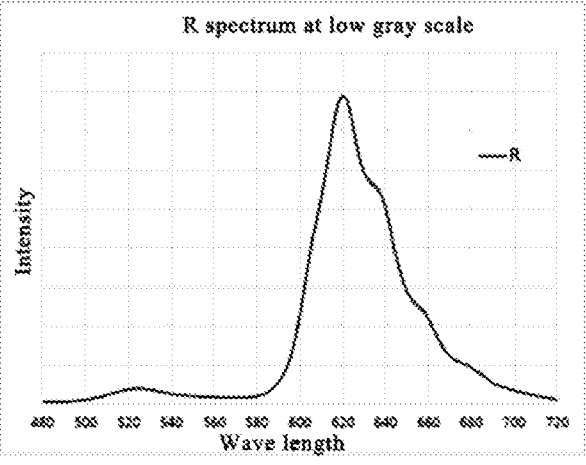
FIG. 5 shows a spectral diagram of a red sub-pixel illuminated at a low gray scale.

If the order of evaporation is: the organic light-emitting layer of the blue sub-pixel→the organic light-emitting layer of the green sub-pixel→the organic light-emitting layer of the red sub-pixel, then, as shown in FIG. 3, the order of manufacturing of the light-emitting unit is as follows: 1. evaporation of a hole injection layer (HIL) on the TFT array substrate; 2. evaporation of a hole transport layer (HTL); 3. evaporation of an electron blocking layer of the blue sub-pixel (B-EBL); 4. evaporation of a light-emitting layer of the blue sub-pixel (B-EML); 5. evaporation of an electron blocking layer of the green sub-pixel (G-EBL); 6. evaporation of a light-emitting layer of the green sub-pixel (G-EML); 7. evaporation of an electron blocking layer of the red sub-pixel (R-EBL); 8. evaporation of a light-emitting layer of the red sub-pixel (R-EML); 9. evaporation of a hole blocking layer (HBL); 10. evaporation of an electron transport layer (ETL); 11. evaporation of an electron injection layer (EIL); 12. evaporation of a cathode CTD; 13. evaporation of a capping layer (CPL). The hole injection layer, the hole transport layer, the hole blocking layer, the electron transport layer, the electron injection layer, the cathode and the capping layer are made by Open Mask, and the electron blocking layer of the blue sub-pixel, the light-emitting layer of the blue sub-pixel, the electron blocking layer of the green sub-pixel, the light-emitting layer of the green sub-pixel, the electron blocking layer of the red sub-pixel and the light-emitting layer of the red sub-pixel are made with a fine metal mask (FMM). Specifically, as the FMM has a certain thickness, shadows may appear during evaporation of organic material, and the PDL Gap is very small, which will lead to overlapping between organic light-emitting layers of different sub-pixels: the light-emitting layer of the blue sub-pixel overlaps the electron blocking layer of the green sub-pixel, and the light-emitting layer of the green sub-pixel overlaps the electron blocking layer of the red sub-pixel, where the material used for the electron blocking layer of the red sub-pixel is similar to that of the hole transport layer, and the mobility of holes is high, so that when the red sub-pixel is illuminated, holes will transport laterally to be transported from the electron blocking layer of the red sub-pixel to the light-emitting layer of the green sub-pixel, which also illuminates the green sub-pixel. As shown in FIG. 5, especially when the red sub-pixel is displayed at a low gray scale, the illumination of the adjacent green sub-pixel may cause more severe crosstalk to the red sub-pixel because the luminance of the red sub-pixel is not very high.

Figure 6:
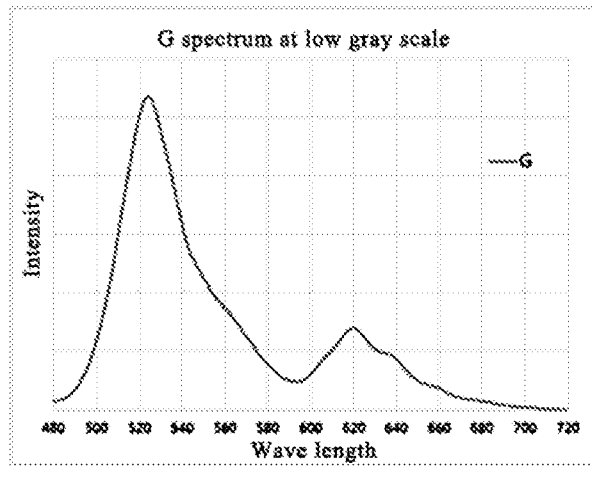
FIG. 6 shows a spectral diagram of a green sub-pixel illuminated at a low gray scale.

If the order of evaporation is: the organic light-emitting layer of the blue sub-pixel→the organic light-emitting layer of the red sub-pixel→the organic light-emitting layer of the green sub-pixel, as shown in FIG. 4, the order of manufacturing of the light-emitting unit is as follows: 1. evaporation of a hole injection layer (HIL) on the TFT array substrate; 2. evaporation of a hole transport layer (HTL); 3. evaporation of an electron blocking layer of the blue sub-pixel (B-EBL); 4. evaporation of a light-emitting layer of the blue sub-pixel (B-EML); 5. evaporation of an electron blocking layer of the red sub-pixel (R-EBL); 6. evaporation of a light-emitting layer of the red sub-pixel (R-EML); 7. evaporation of an electron blocking layer of the green sub-pixel (G-EBL); 8. evaporation of a light-emitting layer of the green sub-pixel (G-EML); 9. evaporation of a hole blocking layer (HBL); 10. evaporation of an electron transport layer (ETL); 11. evaporation of an electron injection layer (EIL); 12. evaporation of a cathode (CTD); 13. evaporation of a capping layer (CPL). The hole injection layer, the hole transport layer, the hole blocking layer, the electron transport layer, the electron injection layer, the cathode and the capping layer are made by Open Mask, and the electron blocking layer of the blue sub-pixel, the light-emitting layer of the blue sub-pixel, the electron blocking layer of the green sub-pixel, the light-emitting layer of the green sub-pixel, the electron blocking layer of the red sub-pixel and the light-emitting layer of the red sub-pixel are made with a fine metal mask (FMM). Specifically, as the FMM has a certain thickness, shadows may appear during evaporation of organic material, and the PDL Gap is very small, which will lead to overlapping between organic light-emitting layers of different sub-pixels: the light-emitting layer of the blue sub-pixel overlaps the electron blocking layer of the red sub-pixel, and the light-emitting layer of the red sub-pixel overlaps the electron blocking layer of the green sub-pixel, where the material used for the electron blocking layer of the green sub-pixel is similar to that of the hole transport layer, and the mobility of holes is high, so that when the green sub-pixel is illuminated, holes will transport laterally to be transported from the electron blocking layer of the green sub-pixel to the light-emitting layer of the red sub-pixel, which also illuminates the red sub-pixel. As shown in FIG. 6, especially when the green sub-pixel is displayed at a low gray scale, the illumination of the adjacent red sub-pixel may cause more severe crosstalk to the green sub-pixel because the luminance of the green sub-pixel is not very high.

Figure 7:
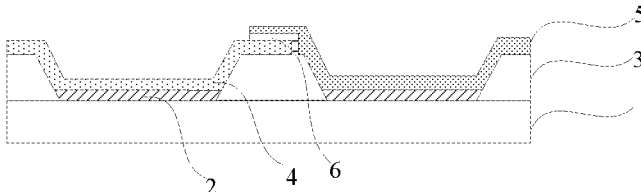
FIG. 7 shows a schematic cross-sectional view of a display substrate in accordance with an embodiment of the present disclosure.

In order to prevent crosstalk between adjacent sub-pixels, as shown in FIG. 7, in this embodiment, an insulating blocking layer 6 is provided between the first organic light-emitting layer 4 and the second organic light-emitting layer 5, and the first organic light-emitting layer 4 and the second organic light-emitting layer 5 are prevented from being in contact by the blocking layer 6, so that when the first sub-pixel is illuminated, even if holes laterally transport in the first organic light-emitting layer 4, the holes will be blocked by the blocking layer 6 and will not transport to the second organic light-emitting layer 4, and will not illuminate the second sub-pixel, thereby preventing the first sub-pixel from being affected by the second sub-pixel.

The blocking layer may be provided between the organic light-emitting layers of any two adjacent sub-pixels, and in some embodiments, the display substrate further includes a third sub-pixel, the third sub-pixel includes a third organic light-emitting layer, the blocking layer includes a first blocking layer and a second blocking layer, the first blocking layer is located between the first organic light-emitting layer and the second organic light-emitting layer, and the second blocking layer is located between the second organic light-emitting layer and the third organic light-emitting layer. In this way, crosstalk between any two adjacent sub-pixels can be prevented, and the blocking layer may also be provided only between adjacent sub-pixels where crosstalk is likely to occur.

In some embodiments, a distance between a surface of the first blocking layer on the side close to the base substrate and a surface of the base substrate on the side close to the first blocking layer is a first distance, the distance between a surface of the second blocking layer on the side close to the base substrate and a surface of the base substrate on the side close to the second blocking layer is a second distance, and the first distance is different from the second distance.

In some embodiments, the display substrate includes a red sub-pixel, a green sub-pixel and a blue sub-pixel, and the first sub-pixel and the second sub-pixel are selected from the red sub-pixel, the green sub-pixel and the blue sub-pixel. That is, the blocking layer may be provided between the organic light-emitting layer of the red sub-pixel and the organic light-emitting layer of the green sub-pixel, or may be provided between the organic light-emitting layer of the red sub-pixel and the organic light-emitting layer of the blue sub-pixel, or may be provided between the organic light-emitting layer of the blue sub-pixel and the organic light-emitting layer of the green sub-pixel.

In some embodiments, the first sub-pixel is one selected from the green sub-pixel and the red sub-pixel, and the second sub-pixel is the other one selected from the green sub-pixel and the red sub-pixel. Because the difference between the turn-on voltage of the blue sub-pixel and the turn-on voltages of the red sub-pixel and the green sub-pixel is large, and the turn-on voltages of the red sub-pixel and the green sub-pixel are close, crosstalk does not easily occur between the blue sub-pixel and the red sub-pixel or between the blue sub-pixel and the green sub-pixel, but may easily occur between the red sub-pixel and the green sub-pixel. Therefore, it is possible to provide a blocking layer only between the organic light-emitting layer of the red sub-pixel and the organic light-emitting layer of the green sub-pixel, and thus no blocking layer is needed between the organic light-emitting layer of the blue sub-pixel and the organic light-emitting layer of the red sub-pixel or between the organic light-emitting layer of the blue sub-pixel and the organic light-emitting layer of the green sub-pixel, so that the construction and manufacturing process of the OLED display substrate are simplified.

In some embodiments, as shown in FIGS. 3 and 4, the display substrate further includes a hole transport layer between the organic light-emitting layer and the base substrate, and in this embodiment, the blocking layer is located on a side of the hole transport layer away from the base substrate.

In some embodiments, as shown in FIGS. 3 and 4, in a direction away from the base substrate, the organic light-emitting layer includes an electron blocking layer (EBL) and a light-emitting layer (EML), which are laminated.

If the blocking layer includes a first blocking layer and a second blocking layer, the first blocking layer is located between the first organic light-emitting layer and the second organic light-emitting layer, and the second blocking layer is located between the second organic light-emitting layer and the third organic light-emitting layer, then the first blocking layer is located between the EML of the first organic light-emitting layer and the EBL of the second organic light-emitting layer, and the second blocking layer is located between the EML of the second organic light-emitting layer and the EBL of the third organic light-emitting layer. In this way, transport of holes from the EBL of the second organic light-emitting layer to the first organic light-emitting layer and transport of holes from the EBL of the third organic light-emitting layer to the second organic light-emitting layer can be avoided. In the structure shown in FIG. 3, in this embodiment, the first blocking layer may be provided between B-EML and G-EBL, and the second blocking layer may be provided between G-EML and R-EBL. In the structure shown in FIG. 4, in this embodiment, the first blocking layer may be provided between B-EML and R-EBL, and the second blocking layer may be provided between R-EML and G-EBL.

In order to prevent the contact between the first organic light-emitting layer 4 and the second organic light-emitting layer 5 as far as possible, the orthographic projection of the blocking layer onto the base substrate needs to cover at least the overlapping area, namely, the orthographic projection of the blocking layer onto the base substrate covers the whole overlapping area. If the coverage area of the blocking layer is too large, for example, the overlapping area of the blocking layer and the first organic light-emitting layer is too large, the display of the first sub-pixel may be affected. If the overlapping area of the blocking layer and the second organic light-emitting layer is too large, the display of the second sub-pixel will be affected. Therefore, the area of the blocking layer should not be arranged too large, and only needs to cover the overlapping area, namely, the orthographic projection of the blocking layer onto the base substrate coincides with the overlapping area.

As shown in FIG. 7, in a direction away from the base substrate, the display substrate includes an anode 2, a pixel definition layer 3, a first organic light-emitting layer 4, a blocking layer 6, and a second organic light-emitting layer 5 which arranged on a TFT array substrate 1 in order. An orthographic projection of a first part, away from the surface of the base substrate, of the first organic light-emitting layer 4 onto the base substrate coincides with the overlapping area, the first organic light-emitting layer 4 includes a first side surface close to the second organic light-emitting layer 5 and intersecting the first part. And absent such a blocking layer, the first side surface might have contacted the second organic light-emitting layer 5. In this embodiment, the first part and the first side surface are covered by the blocking layer so that the blocking layer 6 can completely prevent contact between the first organic light-emitting layer 4 and the second organic light-emitting layer 5 while minimizing the influence on the display of the first organic light-emitting layer 4 and the second organic light-emitting layer 5.

As shown in FIG. 7, the display substrate includes a pixel definition layer 3 on the base substrate, the pixel definition layer 3 includes a plurality of pixel definition layer openings corresponding to sub-pixels, the organic light-emitting layers are located at the pixel definition layer openings, the area where the pixel definition layer is located is a non-light-emitting area, and the orthographic projection of the blocking layer 6 onto the base substrate may be located within the orthographic projection of the pixel definition layer 3 onto the base substrate. In this way, the blocking layer is arranged within the non-light emitting area without affecting the illumination of the sub-pixels.

The material of the blocking layer is characterized by a very low mobility, well below the mobility of the hole transport material, such that holes are substantially not transported in the blocking layer. The blocking layer may have a mobility of less than $10^{-8}$ cm$^2$/(V·s). In particular, the blocking layer may be made of an organic small molecule material, may be made of an organic polymer, or may be made of an inorganic material, such as silicon nitride. The material of the blocking layer does not affect the normal device characteristics of the display substrate, and only serves to block the first organic light-emitting layer and the second organic light-emitting layer.

Silicon nitride has a good insulating property and can prevent transport of holes, and some original film layers of the display substrate, such as a gate insulating layer and an interlayer insulating layer, are mostly made of silicon nitride. If silicon nitride is used to make the blocking layer, an existing display substrate film forming device can be used to make the blocking layer, without the need of an additional film forming device.

If the thickness of the blocking layer is relatively large, the effect on the thickness of the display substrate is relatively obvious. If the thickness of the blocking layer is not large enough, the transport of holes cannot be effectively prevented. The thickness of the blocking layer is preferably set to be within a range of 10-50 nm. When the thickness of the blocking layer is within this range, the transport of holes can be effectively prevented while the thickness of the display substrate is not largely affected.

In the display substrate of this embodiment, the shape of the sub-pixels may be any one selected from a quadrangle, a hexagon, an octagon, a quadrangle with rounded corners, a hexagon with rounded corners, or an octagon with rounded corners, a circle, or an ellipse.

Figure 8:
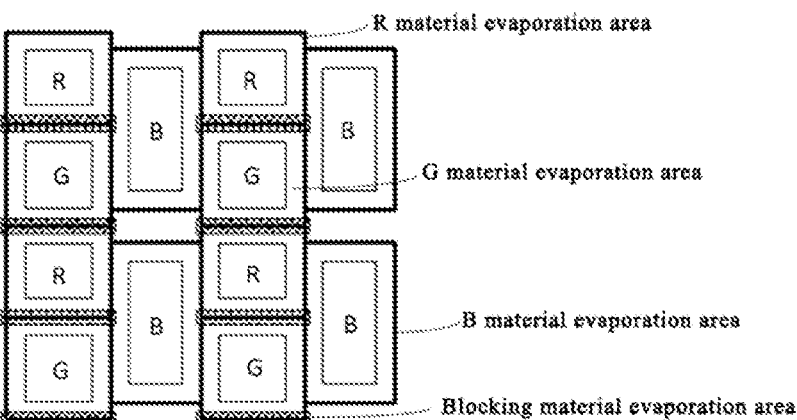
FIGS. 8-10 show schematic diagrams illustrating evaporation of a display substrate in accordance with embodiments of the present disclosure.

Taking an example that the first sub-pixel is one selected from the green sub-pixel and the red sub-pixel, and the second sub-pixel is the other one selected from the green sub-pixel and the red sub-pixel, as shown in FIG. 8, the shape of the sub-pixels is a quadrilateral, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. In this embodiment, the blocking material may be evaporated after the red light-emitting material is evaporated and before the green light-emitting material is evaporated. And the blocking material also may be evaporated after the green light-emitting material is evaporated and before the red light-emitting material is evaporated, so that the organic light-emitting layer of the green sub-pixel cannot contact with the organic light-emitting layer of the red sub-pixel. The thickness of the blocking material may be within a range of 10-50 nm, and the method for forming the blocking material is not limited to evaporation, but may be inkjet printing or chemical vapor deposition.

Figure 9:
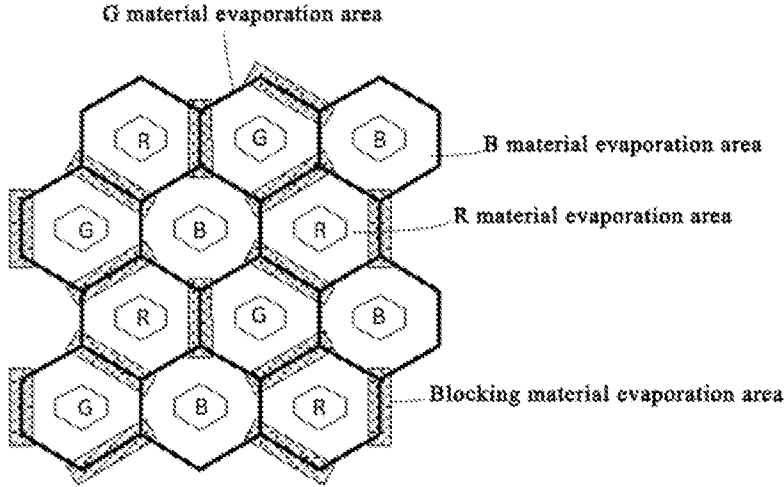

Taking an example that the first sub-pixel is one selected from the green sub-pixel and the red sub-pixel, and the second sub-pixel is the other one selected from the green sub-pixel and the red sub-pixel, as shown in FIG. 9, the shape of the sub-pixels is a hexagon, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. In this embodiment, the blocking material may be evaporated after the red light-emitting material is evaporated and before the green light-emitting material is evaporated. And the blocking material also may be evaporated after the green light-emitting material is evaporated and before the red light-emitting material is evaporated, so that the organic light-emitting layer of the green sub-pixel cannot contact with the organic light-emitting layer of the red sub-pixel. The thickness of the blocking material may be within a range of 10-50 nm, and the method for forming the blocking material is not limited to evaporation, but may be inkjet printing or chemical vapor deposition.

Figure 10:
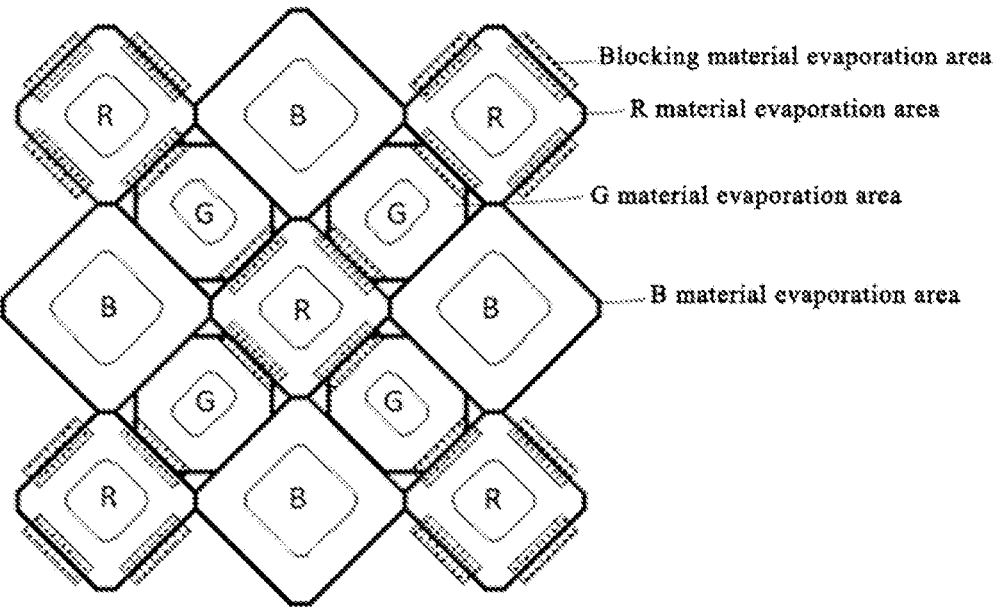

Taking an example that the first sub-pixel is one selected from the green sub-pixel and the red sub-pixel, and the second sub-pixel is the other one selected from the green sub-pixel and the red sub-pixel, as shown in FIG. 10, the shape of the sub-pixels is a quadrilateral with rounded corners, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. In this embodiment, the blocking material may be evaporated after the red light-emitting material is evaporated and before the green light-emitting material is evaporated. And the blocking material also may be evaporated after the green light-emitting material is evaporated and before the red light-emitting material is evaporated, so that the organic light-emitting layer of the green sub-pixel cannot contact with the organic light-emitting layer of the red sub-pixel. The thickness of the blocking material may be within a range of 10-50 nm, and the method for forming the blocking material is not limited to evaporation, but may be inkjet printing or chemical vapor deposition.

An embodiment of the present disclosure further provides a display device including the display substrate described above.

The display device includes, but is not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display device, etc.

The display device may be: any product or component with a display function, such as a television, a display, a digital photo frame, a mobile phone, a tablet computer, and among others, the display device further includes a flexible circuit board, a printed circuit board and a back panel.

An embodiment of the present disclosure further provides a method for manufacturing a display substrate. The display substrate including a first sub-pixel and a second sub-pixel provided on a base substrate and having different colors, wherein an orthographic projection of a first organic light-emitting layer of the first sub-pixel and an orthographic projection of a second organic light-emitting layer of the second sub-pixel onto the base substrate have an overlapping area. The manufacturing method includes: forming an insulating blocking layer between the first organic light-emitting layer and the second organic light-emitting layer, wherein an orthographic projection of the blocking layer onto the base substrate covers at least part of the overlapping area.

The first organic light-emitting layer is an organic light-emitting layer of one sub-pixel of two adjacent sub-pixels, and the second organic light-emitting layer is an organic light-emitting layer of the other sub-pixel of the two adjacent sub-pixels. The positions of the first organic light-emitting layer and the second organic light-emitting layer are not limited, and the first organic light-emitting layer may be located on a side of the second organic light-emitting layer close to the base substrate, and may also be located on a side of the second organic light-emitting layer away from the base substrate. In manufacturing of the OLED display substrate, it is possible that the first organic light-emitting layer is evaporated first, and then the second organic light-emitting layer is evaporated. Alternatively it is also possible that the second organic light-emitting layer is evaporated first, and then the first organic light-emitting layer is evaporated. As the first organic light-emitting layer and the second organic light-emitting layer are adjacent in the evaporation sequence, there is a possibility that the first organic light-emitting layer and the second organic light-emitting layer overlap.

In this embodiment, the insulating blocking layer is formed at the junction of the first organic light-emitting layer and the second organic light-emitting layer, and the blocking layer can block the flow of holes. When the first sub-pixel is illuminated, the blocking layer can block holes injected from the first organic light-emitting layer into the second organic light-emitting layer, so as to prevent illuminating the second sub-pixel at the same time as illuminating the first sub-pixel. Alternatively, when the second sub-pixel is illuminated, the blocking layer can block holes injected from the second organic light-emitting layer into the first organic light-emitting layer, so as to prevent illuminating the first sub-pixel at the same time as illuminating the second sub-pixel, so that crosstalk can be prevented between adjacent pixels, and the display effect can be ensured.

In some embodiments, the manufacturing method specifically includes: forming the first organic light-emitting layer;

forming the blocking layer in the overlapping area by evaporation or inkjet printing or chemical vapor deposition; and forming the second organic light-emitting layer.

Taking an example that the blocking layer is formed by evaporation, in a specific example, the order of evaporation of a light-emitting unit for manufacturing the display substrate is as follows: 1. evaporation of a hole injection layer (HIL) on the TFT array substrate; 2. evaporation of a hole transport layer (HTL); 3. evaporation of an electron blocking layer of the blue sub-pixel (B-EBL); 4. evaporation of a light-emitting layer of the blue sub-pixel (B-EML); 5. evaporation of an electron blocking layer of the green sub-pixel (G-EBL); 6. evaporation of a light-emitting layer of the green sub-pixel (G-EML); 7. evaporation of a blocking layer with a blocking material; 8. evaporation of an electron blocking layer of the red sub-pixel (R-EBL); 9. evaporation of a light-emitting layer of the red sub-pixel (R-EML); 10. evaporation of a hole blocking layer (HBL); 11. evaporation of an electron transport layer (ETL); 12. evaporation of an electron injection layer (EIL); 13. evaporation of a cathode CTD; 14. evaporation of a capping layer (CPL). The hole injection layer, the hole transport layer, the hole blocking layer, the electron transport layer, the electron injection layer, the cathode and the capping layer are made by Open Mask, and the electron blocking layer of the blue sub-pixel, the light-emitting layer of the blue sub-pixel, the electron blocking layer of the green sub-pixel, the light-emitting layer of the green sub-pixel, the blocking layer, the electron blocking layer of the red sub-pixel and the light-emitting layer of the red sub-pixel are made with a fine metal mask (FMM).

In this way, the light-emitting layer of the green sub-pixel is prevented from overlapping with the electron blocking layer of the red sub-pixel, so as to prevent from happening such disadvantageous situation that, when the red sub-pixel is displayed at a low gray scale, the illumination of the adjacent green sub-pixel may cause relatively serious crosstalk to the red sub-pixel.

In another specific example, the order of manufacturing of a light-emitting unit may be as follows: 1. evaporation of a hole injection layer (HIL) on the TFT array substrate; 2. evaporation of a hole transport layer (HTL); 3. evaporation of an electron blocking layer of the blue sub-pixel (B-EBL); 4. evaporation of a light-emitting layer of the blue sub-pixel (B-EML); 5. evaporation of an electron blocking layer of the red sub-pixel (R-EBL); 6. evaporation of a light-emitting layer of the red sub-pixel (R-EML); 7. evaporation of a blocking layer having a thickness of 10-50 nm with a blocking material; 8. evaporation of an electron blocking layer of the green sub-pixel (G-EBL); 9. evaporation of a light-emitting layer of the green sub-pixel (G-EML); 10. evaporation of a hole blocking layer (HBL); 11. evaporation of an electron transport layer (ETL); 12. evaporation of an electron injection layer (EIL); 13. evaporation of a cathode CTD; 14. evaporation of a capping layer (CPL). The hole injection layer, the hole transport layer, the hole blocking layer, the electron transport layer, the electron injection layer, the cathode and the capping layer are made by Open Mask, and the electron blocking layer of the blue sub-pixel, the light-emitting layer of the blue sub-pixel, the electron blocking layer of the green sub-pixel, the light-emitting layer of the green sub-pixel, the blocking layer, the electron blocking layer of the red sub-pixel and the light-emitting layer of the red sub-pixel are made with a fine metal mask (FMM).

In this way, the light-emitting layer of the red sub-pixel is prevented from overlapping with the electron blocking layer of the green sub-pixel, so as to prevent from happening such disadvantageous situation that, when the green sub-pixel is displayed at a low gray scale, the illumination of the adjacent red sub-pixel may cause relatively serious crosstalk to the green sub-pixel.

An embodiment of the present disclosure further provides a high-precision metal mask plate for manufacturing the display substrate described above, including: a plurality of opening areas, the plurality of opening areas including a first opening area corresponding to the position of sub-pixels of the display substrate, and further including a second opening area corresponding to the overlapping area.

In the display substrate of this embodiment, the shape of the sub-pixels is any one selected from a quadrangle, a hexagon, an octagon, a quadrangle with rounded corners, a hexagon with rounded corners, or an octagon with rounded corners, a circle, or an ellipse. The first opening area of the high-precision metal mask plate has a shape the same as that of the sub-pixel, and may be any one selected from a quadrangle, a hexagon, an octagon, a quadrangle with rounded corners, a hexagon with rounded corners, or an octagon with rounded corners, a circle, or an ellipse.

Taking an example that the first sub-pixel is one selected from the green sub-pixel and the red sub-pixel, and the second sub-pixel is the other one selected from the green sub-pixel and the red sub-pixel, as shown in FIG. 8, the shape of the sub-pixels is a quadrilateral, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. The blocking material may be evaporated after the red light-emitting material is evaporated and before the green light-emitting material is evaporated; and the blocking material also may be evaporated after the green light-emitting material is evaporated and before the red light-emitting material is evaporated, so that the organic light-emitting layer of the green sub-pixel cannot contact with the organic light-emitting layer of the red sub-pixel.

The first opening area of the high-precision metal mask plate corresponding to the embodiment shown in FIG. 8 is a quadrilateral for evaporating a light-emitting material to form sub-pixels. The high-precision metal mask plate further includes an elongated second opening area for evaporating a blocking material in the blocking material evaporation area to form a blocking layer.

Taking an example that the first sub-pixel is one selected from the green sub-pixel and the red sub-pixel, and the second sub-pixel is the other one selected from the green sub-pixel and the red sub-pixel, as shown in FIG. 9, the shape of the sub-pixels is a hexagon, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. The blocking material may be evaporated after the red light-emitting material is evaporated and before the green light-emitting material is evaporated; and the blocking material also may be evaporated after the green light-emitting material is evaporated and before the red light-emitting material is evaporated, so that the organic light-emitting layer of the green sub-pixel cannot contact with the organic light-emitting layer of the red sub-pixel.

The first opening area of the high-precision metal mask plate corresponding to the embodiment shown in FIG. 9 is a hexagon for evaporating a light-emitting material to form sub-pixels. The high-precision metal mask plate further includes an elongated second opening area for evaporating a blocking material in the blocking material evaporation area to form a blocking layer.

Taking an example that the first sub-pixel is one selected from the green sub-pixel and the red sub-pixel, and the second sub-pixel is the other one selected from the green sub-pixel and the red sub-pixel, as shown in FIG. 10, the shape of the sub-pixels is a quadrilateral with rounded corners, and the area marked with R is an R material evaporation area for evaporating a red light-emitting material to form an organic light-emitting layer of a red sub-pixel; the area marked with B is a B material evaporation area for evaporating a blue light-emitting material to form an organic light-emitting layer of a blue sub-pixel; and the area marked G is a G material evaporation area for evaporating a green light-emitting material to form an organic light-emitting layer of a green sub-pixel. At the intersection of the area marked with G and the area marked with R, a blocking material evaporation area is provided for evaporating a blocking material to form a blocking layer. The blocking material may be evaporated after the red light-emitting material is evaporated and before the green light-emitting material is evaporated; and the blocking material also may be evaporated after the green light-emitting material is evaporated and before the red light-emitting material is evaporated, so that the organic light-emitting layer of the green sub-pixel cannot contact with the organic light-emitting layer of the red sub-pixel.

The first opening area of the high-precision metal mask plate corresponding to the embodiment shown in FIG. 10 is a rounded quadrilateral for evaporating a light-emitting material to form sub-pixels. The high-precision metal mask plate further includes an elongated second opening area for evaporating a blocking material in the blocking material evaporation area to form a blocking layer.

It should be noted that the various embodiments described herein are described in a progressive manner with reference to the same or similar parts throughout the various embodiments, with each embodiment focusing on differences from the other embodiments. In particular, the embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the present disclosure has been described with reference to specific embodiments thereof, it will be understood by those skilled in the art that various changes may be made and equivalents may be substituted for elements thereof without departing from the scope of the disclosure. Accordingly, the protection sought herein is as set forth in the claims below.

What is claimed is:

1. A display substrate, comprising a first sub-pixel, a second sub-pixel and a third sub-pixel provided on a base substrate, wherein the first sub-pixel is red, the second sub-pixel is green, and the third sub-pixel is blue, wherein an orthographic projection of a first organic light-emitting layer of the first sub-pixel and an orthographic projection of a second organic light-emitting layer of the second sub-pixel onto the base substrate have a first overlapping area, wherein the orthographic projection of the second organic light-emitting layer and an orthographic projection of a third organic light-emitting layer of the third sub-pixel onto the base substrate have a second overlapping area, wherein the orthographic projection of the third organic light-emitting layer and the orthographic projection of the first organic light-emitting layer onto the base substrate have a third overlapping area, wherein an insulating blocking layer is sandwiched between the first organic light-emitting layer and the second organic light-emitting layer in the first overlapping area, and configured to block flow of holes therebetween, wherein the insulating blocking layer is not present in the second overlapping area of and the insulating blocking layer is not present in the third overlapping area.

2. The display substrate according to claim 1, wherein the orthographic projection of the insulating blocking layer onto the base substrate covers the whole first overlapping area.

3. The display substrate according to claim 1, wherein the first organic light-emitting layer, the insulating blocking layer and the second organic light-emitting layer are arranged in sequence in a direction away from the base substrate, an orthographic projection of a first part, away from the surface of the base substrate, of the first organic light-emitting layer onto the base substrate coincides with the first overlapping area, wherein the first organic light-emitting layer comprises a first side surface close to the second organic light-emitting layer and intersecting the first part, and the insulating blocking layer covers the first part and the first side surface.

4. The display substrate according to claim 1, wherein the display substrate comprises a pixel definition layer on the base substrate, the pixel definition layer comprises a plurality of pixel definition layer openings corresponding to sub-pixels, and the orthographic projection of the insulating blocking layer onto the base substrate is located within an orthographic projection of the pixel definition layer onto the base substrate.

5. The display substrate according to claim 1, wherein the display substrate further comprises a hole transport layer between the first organic light-emitting layer and the second organic light-emitting layer and the base substrate, and the insulating blocking layer is located on a side of the hole transport layer away from the base substrate.

6. The display substrate according to claim 1, wherein the insulating blocking layer has a thickness of 10 nm to 50 nm.

7. The display substrate according to claim 1, wherein the insulating blocking layer has a mobility of less than $10^{-8}$ $cm^2/(V \cdot s)$.

8. The display substrate according to claim 7, wherein the insulating blocking layer is made of silicon nitride.

9. A display device, comprising a display substrate, the display substrate comprising a first sub-pixel, a second sub-pixel, and a third sub-pixel provided on a base substrate, wherein the first sub-pixel is red, the second sub-pixel is green, and the third sub-pixel is blue, wherein an orthographic projection of a first organic light-emitting layer of the first sub-pixel and an orthographic projection of a second organic light-emitting layer of the second sub-pixel onto the base substrate have a first overlapping area, wherein the orthographic projection of the second organic light-emitting layer and an orthographic projection of a third organic light-emitting layer of the third sub-pixel onto the base substrate have a second overlapping area, wherein the orthographic projection of the third organic light-emitting layer and the orthographic projection of the first organic light-emitting layer onto the base substrate have a third overlapping area, wherein an insulating blocking layer is sandwiched between the first organic light-emitting layer and the second organic light-emitting layer in the first overlapping area, and configured to block flow of holes therebetween, wherein the insulating blocking layer is not present in the second overlapping area er and the insulating blocking layer is not present in the third overlapping area.

10. The display device according to claim 9, wherein the orthographic projection of the insulating blocking layer onto the base substrate covers the whole first overlapping area.

11. The display device according to claim 9, wherein the first organic light-emitting layer, the insulating blocking layer and the second organic light-emitting layer are arranged in sequence in a direction away from the base substrate, an orthographic projection of a first part, away from the surface of the base substrate, of the first organic light-emitting layer onto the base substrate coincides with the first overlapping area, wherein the first organic light-emitting layer comprises a first side surface close to the second organic light-emitting layer and intersecting the first part, and the insulating blocking layer covers the first part and the first side surface.

12. A method for manufacturing a display substrate, the display substrate comprising a first sub-pixel, a second sub-pixel, and a third sub-pixel provided on a base substrate, wherein the first sub-pixel is red, the second sub-pixel is green, and the third sub-pixel is blue, wherein an orthographic projection of a first organic light-emitting layer of the first sub-pixel and an orthographic projection of a second organic light-emitting layer of the second sub-pixel onto the base substrate have a first overlapping area, wherein the orthographic projection of the second organic light-emitting layer and an orthographic projection of a third organic light-emitting layer of the third sub-pixel onto the base substrate have a second overlapping area, wherein the orthographic projection of the third organic light-emitting layer and the orthographic projection of the first organic light-emitting layer onto the base substrate have a third overlapping area, the manufacturing method comprising:

forming an insulating blocking layer, wherein the insulating blocking layer is sandwiched between the first organic light-emitting layer and the second organic light-emitting layer in the first overlapping area, and configured to block flow of holes therebetween, wherein the insulating blocking layer is not present in the second overlapping area er and the insulating blocking layer is not present in the third overlapping area.

13. The method according to claim 12, wherein the manufacturing method specifically comprises:

forming the first organic light-emitting layer;

forming the insulating blocking layer in the first overlapping area; and forming the second organic light-emitting layer.

* * * * *